(12) United States Patent
Hogiri et al.

(10) Patent No.: US 11,105,482 B2
(45) Date of Patent: Aug. 31, 2021

(54) LIGHT SOURCE DEVICE, PROJECTOR, AND VEHICLE

(71) Applicant: Panasonic Intellectual Property Management Co., Ltd., Osaka (JP)

(72) Inventors: Masayuki Hogiri, Osaka (JP); Yuki Ueda, Osaka (JP); Yoshihisa Nagasaki, Osaka (JP); Kojiro Okuyama, Nara (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 17/142,821

(22) Filed: Jan. 6, 2021

(65) Prior Publication Data
US 2021/0123577 A1 Apr. 29, 2021

Related U.S. Application Data

(63) Continuation of application No. PCT/JP2019/024766, filed on Jun. 21, 2019.

(30) Foreign Application Priority Data

Jul. 12, 2018 (JP) .............................. JP2018-132063

(51) Int. Cl.
*F21S 41/173* (2018.01)
*G03B 21/20* (2006.01)
(Continued)

(52) U.S. Cl.
CPC .......... *F21S 41/173* (2018.01); *G03B 21/204* (2013.01); *F21S 41/16* (2018.01); *F21Y 2105/10* (2016.08); *F21Y 2115/30* (2016.08)

(58) Field of Classification Search
CPC .......... F21S 41/16; F21S 41/173; F21S 41/20; F21Y 2105/10; F21Y 2115/30; G03B 21/2033–204
(Continued)

(56) References Cited

U.S. PATENT DOCUMENTS

| 5,998,925 A | 12/1999 | Shimizu et al. |
| 2012/0326196 A1 | 12/2012 | Zheng |

(Continued)

FOREIGN PATENT DOCUMENTS

| JP | 2004-315342 | 11/2004 |
| JP | 2015-4071 | 1/2015 |

(Continued)

OTHER PUBLICATIONS

International Search Report dated Sep. 24, 2019 in corresponding International Application No. PCT/JP2019/024766.

*Primary Examiner* — Jason M Han
(74) *Attorney, Agent, or Firm* — Wenderoth, Lind & Ponack, L.L.P.

(57) ABSTRACT

A light source device includes: an excitation light source that emits excitation light having an energy density of 10 W/mm² or more; and a phosphor layer that has phosphor particles embedded in the matrix. The phosphor particles include at least one selected from the group consisting of metal oxides represented by a following formula (1) and metal oxides represented by a following formula (2).

$$Y_{3-x1-y1}R^1_{y1}Ce_{x1}Al_{5-z1}Ga_{z1}O_{12} \quad (1)$$

$$Y_{3-x2-y2}R^2_{y2}Ce_{x2}Al_{5-z2}Sc_{z2}O_{12} \quad (2)$$

In the formula (1), $R^1$ includes at least one selected from the group consisting of Gd and Tb, and $x_1$, $y_1$, and $z_1$ satisfy $0.003 \leq x_1 \leq 0.03$, $0 \leq y_1 \leq 2.1$, and $0 \leq z_1 \leq 2.2$, respectively. In the formula (2), $R^2$ includes at least one selected from the group (Continued)

consisting of Gd and Tb, and $x_2$, $y_2$, and $z_2$ satisfy $0.003 \leq x_2 \leq 0.03$, $0 \leq y_2 \leq 2.1$ and $0 \leq z_2 \leq 1.5$, respectively.

8 Claims, 5 Drawing Sheets

(51) Int. Cl.
*F21Y 115/30* (2016.01)
*F21Y 105/10* (2016.01)
*F21S 41/16* (2018.01)

(58) Field of Classification Search
USPC .......................... 362/230–231, 249.02, 293, 362/311.02–311.03, 510
See application file for complete search history.

(56) References Cited

U.S. PATENT DOCUMENTS

| | | |
|---|---|---|
| 2014/0071683 A1 | 3/2014 | Hamada et al. |
| 2015/0060916 A1 | 3/2015 | Nagasaki et al. |
| 2015/0083967 A1 | 3/2015 | Watanabe et al. |
| 2016/0240748 A1 | 8/2016 | Inomata et al. |
| 2018/0044588 A1 | 2/2018 | Watanabe et al. |

FOREIGN PATENT DOCUMENTS

| | | |
|---|---|---|
| JP | 2015-61009 | 3/2015 |
| JP | 2015-72895 | 4/2015 |
| JP | 2017-107072 | 6/2017 |
| JP | 6241002 | 12/2017 |
| WO | 98/05078 | 2/1998 |
| WO | 2011/123538 | 10/2011 |
| WO | 2013/172025 | 11/2013 |
| WO | 2015/060254 | 4/2015 |

LIGHT SOURCE DEVICE, PROJECTOR, AND VEHICLE

BACKGROUND

1. Technical Field

The present disclosure relates to a light source device, a projector, and a vehicle.

2. Description of the Related Art

In recent years, a light source device including an excitation light source and a wavelength conversion member has been developed. The wavelength conversion member includes a phosphor. Light of the excitation light source is applied as excitation light to the phosphor, and fluorescent light having a wavelength longer than a wavelength of the excitation light is emitted from the phosphor. In this type of light source device, it is required to increase brightness and output of the light.

Figure 10:
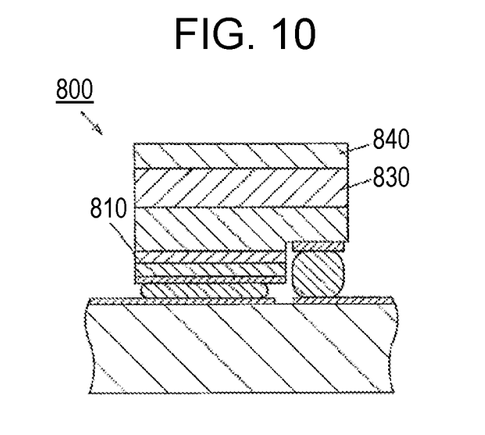
FIG. 10 is a schematic cross-sectional view of a conventional light source device.

As illustrated in FIG. 10, Patent Literature (PTL) 1 describes, as an example of a light source device, light emitting element 800 including light emitting layer 810, element substrate 830, and phosphor 840. Light emitting layer 810 emits blue light. Phosphor 840 is a flat plate-shaped single crystal. Light emitted by light emitting layer 810 passes through element substrate 830 and enters phosphor 840. Phosphor 840 converts a wavelength of the light emitted by light emitting layer 810.

PTL 1 is Japanese Patent No. 6,241,002. PTL 2 is WO2013/172025. PTL 3 is Unexamined Japanese Patent Publication No. 2004-315342.

SUMMARY

It is difficult to efficiently obtain light having high brightness from light emitting element 800 of PTL 1.

The present disclosure provides a light source device capable of efficiently obtaining light having high brightness.

A light source device according to an aspect of the present disclosure has the following configuration. That is, the light source device includes: an excitation light source that emits excitation light having an energy density of 10 W/mm$^2$ or more; and a phosphor layer that has a matrix and phosphor particles embedded in the matrix. Then, the phosphor particles include at least one selected from the group consisting of metal oxides represented by the following formula (1) and metal oxides represented by the following formula (2).

$$Y_{3-x1-y1}R^1_{y1}Ce_{x1}Al_{5-z1}Ga_{z1}O_{12} \quad (1)$$

$$Y_{3-x2-y2}R^2_{y2}Ce_{x2}Al_{5-z2}Sc_{z2}O_{12} \quad (2)$$

In the formula (1), $R^1$ includes at least one selected from the group consisting of Gd and Tb, and $x_1$, $y_1$, and $z_1$ satisfy $0.003 \leq x_1 \leq 0.03$, $0 \leq y_1 \leq 2.1$, and $0 \leq z_1 \leq 2.2$, respectively. In the formula (2), $R^2$ includes at least one selected from the group consisting of Gd and Tb, and $x_2$, $y_2$, and $z_2$ satisfy $0.003 \leq x_2 \leq 0.03$, $0 \leq y_2 \leq 2.1$, and $0 \leq z_2 \leq 1.5$, respectively.

According to the light source device of the present disclosure, light having high brightness can be obtained efficiently.

DETAILED DESCRIPTION

Knowledge Underlying the Present Disclosure

As a phosphor, for example, in a compound (YAG) represented by $Y_3Al_5O_{12}$, a compound in which a part of Y atoms is replaced by Ce atoms is known. In this phosphor, the Ce atoms function as light emission centers. That is, in this phosphor, the Ce atoms are excited by excitation light and emit fluorescent light.

However, when an energy density of the excitation light is increased, internal quantum efficiency of the phosphor sometimes decreases to a large extent. The internal quantum efficiency of the phosphor means a ratio of a number of photons of light emitted from the phosphor to a number of photons of the excitation light applied to the phosphor. The reason why the internal quantum efficiency of the phosphor decreases is considered as follows. When the energy density of the excitation light is increased, a number of excited Ce atoms also increases in the phosphor. That is, density of the excited Ce atoms increases in the phosphor. Therefore, each of the excited Ce atoms easily absorbs fluorescent light emitted from other Ce atoms located in the vicinity of the Ce atom. The excited Ce atom is further excited to an energy level that does not contribute to the emission of the fluorescent light by absorbing the fluorescent light emitted from the other Ce atoms. This reduces the internal quantum efficiency of the phosphor.

A light source device according to a first aspect of the present disclosure includes: an excitation light source that emits excitation light having an energy density of 10 W/mm$^2$ or more; and a phosphor layer that has a matrix and phosphor particles embedded in the matrix. The phosphor particles include at least one selected from the group consisting of metal oxides represented by the following formula (1) and metal oxides represented by the following formula (2).

$$Y_{3-x1-y1}R^1_{y1}Ce_{x1}Al_{5-z1}Ga_{z1}O_{12} \quad (1)$$

$$Y_{3-x2-y2}R^2_{y2}Ce_{x2}Al_{5-z2}Sc_{z2}O_{12} \quad (2)$$

In the formula (1), $R^1$ includes at least one selected from the group consisting of Gd and Tb, and $x_1$, $y_1$, and $z_1$ satisfy $0.003 \leq x_1 \leq 0.03$, $0 \leq y_1 \leq 2.1$, and $0 \leq z_1 \leq 2.2$, respectively. In the formula (2), $R^2$ includes at least one selected from the group consisting of Gd and Tb, and $x_2$, $y_2$, and $z_2$ satisfy $0.003 \leq x_2 \leq 0.03$, $0 \leq y_2 \leq 2.1$, and $0 \leq z_2 \leq 1.5$, respectively.

According to the first aspect, a content of Ce atoms in the phosphor particles is low. Therefore, even when the phosphor particles are irradiated with the excitation light having an energy density of 10 $W/mm^2$ or more, density of excited Ce atoms is low. Thus, a probability that the excited Ce atoms absorb fluorescent light emitted from other Ce atoms is low. That is, the excited Ce atoms are suppressed from being further excited to an energy level that does not contribute to the emission of the fluorescent light. Thus, the internal quantum efficiency of the phosphor particles can be suppressed from decreasing. Therefore, according to the light source device, light having high brightness can be efficiently obtained.

In a second aspect of the present disclosure, in the light source device according to the first aspect, $y_1$ satisfies $0.1 \leq y_1 \leq 2.1$ in the formula (1), and $y_2$ satisfies $0.1 \leq y_2 \leq 2.1$ in the formula (2). According to the second aspect, the phosphor particles can emit fluorescent light having a long peak wavelength.

In a third aspect of the present disclosure, in the light source device according to the first or second aspect, $x_1$ satisfies $0.003 \leq x_1 \leq 0.024$ in the formula (1), and $x_2$ satisfies $0.003 \leq x_2 \leq 0.024$ in the formula (2). According to the third aspect, even when phosphor particles are irradiated with excitation light having an energy density of 10 $W/mm^2$ or more, the internal quantum efficiency of phosphor particles can be further suppressed from decreasing.

In a fourth aspect of the present disclosure, in the light source device according to any one of the first to third aspects, the matrix includes a zinc oxide crystal oriented along a c-axis. According to the fourth aspect, the phosphor layer has excellent heat dissipation.

In a fifth aspect of the present disclosure, in the light source device according to any one of the first to fourth aspects, a peak wavelength of the excitation light is 360 nm or more and 480 nm or less, and a peak wavelength of fluorescent light emitted by the phosphor particles is 548 nm or more and 580 nm or less. According to the fifth aspect, white light can be easily obtained by mixing the excitation light and the fluorescent light with each other. Moreover, red light having high intensity can be obtained by using a filter or the like that transmits only light having a wavelength of 580 nm or more and 750 nm or less.

In a sixth aspect of the present disclosure, in the light source device according to any one of the first to fifth aspects, a spot diameter of the excitation light to enter the phosphor layer is 10 μm or more and 10 mm or less. According to the sixth aspect, the light emitted from the phosphor layer can be easily condensed. That is, the light emitted from the phosphor layer can be efficiently used. Further, if the spot diameter of the excitation light is within the above range, the excitation light can be efficiently converted into fluorescent light.

A projector according to a seventh aspect of the present disclosure includes the light source device according to any one of the first to sixth aspects. According to the seventh aspect, light having high brightness can be efficiently obtained from the projector.

A vehicle according to an eighth aspect of the present disclosure includes the light source device according to any one of the first to sixth aspects. According to the eighth aspect, light having high brightness can be efficiently obtained from the vehicle.

Hereinafter, an exemplary embodiment of the present disclosure will be described with reference to the drawings. The present disclosure is not limited to the following exemplary embodiment.

Exemplary Embodiment of Light Source Device

Figure 1:
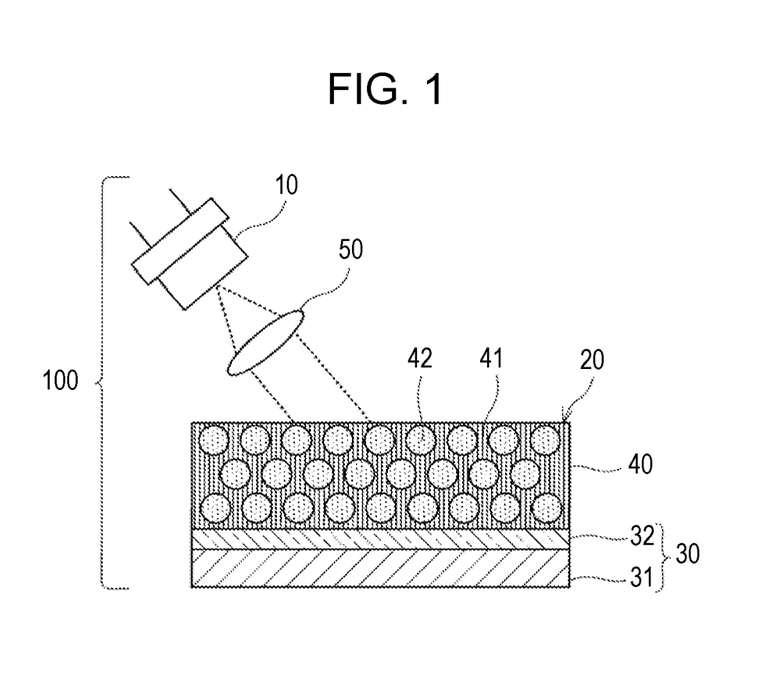
FIG. 1 is a schematic cross-sectional view of a light source device according to an exemplary embodiment of the present disclosure.

As illustrated in FIG. 1, light source device 100 according to the present exemplary embodiment includes excitation light source 10 and wavelength conversion member 20. Excitation light source 10 emits excitation light. Wavelength conversion member 20 is disposed on an optical path of the excitation light emitted from excitation light source 10.

Light source device 100 further includes optical system 50. Optical system 50 may be located on the optical path of the excitation light emitted from excitation light source 10. Optical system 50 includes optical components such as a lens, a mirror, and an optical fiber.

Wavelength conversion member 20 includes substrate 30 and phosphor layer 40. Substrate 30 supports phosphor layer 40. Phosphor layer 40 is disposed on substrate 30. Phosphor layer 40 of wavelength conversion member 20 is located between excitation light source 10 and substrate 30 of wavelength conversion member 20. Light source device 100 is a reflective light source.

Phosphor layer 40 includes matrix 41 and phosphor particles 42. Matrix 41 is present between the respective particles. Phosphor particles 42 are embedded in matrix 41. In other words, phosphor particles 42 are dispersed in matrix 41. Phosphor particles 42 are surrounded by matrix 41.

When excitation light having a first wavelength band is applied to wavelength conversion member 20, wavelength conversion member 20 converts a part of the excitation light into light having a second wavelength band and emits the light. Wavelength conversion member 20 emits light having a wavelength longer than a wavelength of the excitation light. The second wavelength band is a band different from the first wavelength band. However, a part of the second wavelength band may overlap with the first wavelength band. The light emitted from wavelength conversion member 20 may include not only the light emitted from phosphor particles 42 but also the excitation light itself.

Excitation light source 10 is typically a semiconductor light emitting element. The semiconductor light emitting element is, for example, a light emitting diode (LED), a superluminescent diode (SLD), or a laser diode (LD). Excitation light source 10 may be composed of one LD or may be composed of a plurality of LDs. The plurality of LDs may be optically coupled to one another.

An energy density of the excitation light from excitation light source 10 is 10 $W/mm^2$ or more. The energy density of the excitation light may be 100 $W/mm^2$ or more. In order to obtain emitted light from wavelength conversion member 20, an upper limit of the energy density of the excitation light applied to wavelength conversion member 20 is not particularly limited. The energy density of the excitation light may be 1000 $W/mm^2$ or less, may be 400 $W/mm^2$ or less, or may be 200 $W/mm^2$ or less. If the energy density of the excitation light exceeds 1000 $W/mm^2$, the energy density of the excitation light becomes too high, and light emission efficiency of wavelength conversion member 20 decreases. Therefore, in order to efficiently obtain the emitted light from wavelength conversion member 20, the energy density of the excitation light is preferably 10 $W/mm^2$ or more and 1000 W/mm² or less. In order to obtain the emitted light from wavelength conversion member 20 more efficiently the energy density is more preferably 10 W/mm² or more and 400 W/mm² or less, still more preferably 10 W/mm² or more and 200 W/mm² or less. The "energy density" means a value obtained by dividing irradiation energy of the excitation light emitted in a specific range by an area of the range. The energy density can be measured, for example, by the following method. Excitation light is applied to an object. A range in which irradiation intensity of the excitation light is 1/e² or more of peak intensity thereof is specified. e represents a base of a natural logarithm. The irradiation energy of the excitation light applied to the specified range is measured. The area of the specified range is calculated. The energy density is determined by dividing the irradiation energy of the excitation light by the area of the specified range.

A peak wavelength of the excitation light from excitation light source 10 may be 360 nm or more, or may be 400 nm or more. The peak wavelength of the excitation light may be 480 nm or less, or may be 470 nm or less. If the peak wavelength is within these ranges, white light can be easily obtained from wavelength conversion member 20 in combination with the emitted light from wavelength conversion member 20. That is, the peak wavelength of the excitation light for efficiently obtaining white light from wavelength conversion member 20 is preferably 360 nm or more and 480 nm or less, and a more preferable peak wavelength of the excitation light is 400 nm or more and 470 nm or less.

A spot diameter of the excitation light to enter phosphor layer 40 (a spot diameter of the excitation light on a surface of phosphor layer 40) may be 10 µm or more, or may be 50 µm or more. The spot diameter of the excitation light to enter the phosphor layer 40 may be 10 mm or less, or may be 5 mm or less. The spot diameter means a diameter of a circle having the same area as an area of a range where the irradiation intensity of the excitation light is 1/e² or more of the peak intensity. Note that e represents the base of the natural logarithm. The smaller the spot diameter of the excitation light, the easier it is to condense the light emitted from phosphor layer 40. That is, the light emitted from phosphor layer 40 can be efficiently used. However, the smaller the spot diameter of the excitation light, the higher the energy density of the excitation light. When the spot diameter of the excitation light on the surface of phosphor layer 40 is within a range of 10 µm or more and 10 mm or less, particularly within a range of 50 µm or more and 5 mm or less, light having high brightness can be efficiently obtained.

Substrate 30 includes substrate body 31 and thin film 32. Thickness of substrate 30 is larger than, for example, thickness of phosphor layer 40. Substrate body 31 is made of one material selected from the group consisting of sapphire ($Al_2O_3$), gallium nitride (GaN), aluminum nitride (AN), silicon, aluminum, glass, quartz ($SiO_2$), silicon carbide (SiC) and zinc oxide. Substrate body 31 may have a mirror-polished surface. In light source device 100, substrate body 31 does not have translucency for, for example, the excitation light and the light emitted from phosphor particles 42.

The surface of substrate body 31 may be coated with an antireflective film, a dichroic mirror, a metal reflective film, a high reflective film, a protective film, or the like. The antireflective film is a film for preventing reflection of the excitation light. The dichroic mirror may be composed of a dielectric multilayer film. The metal reflective film is a film for reflecting light, and is made of a metal material such as silver and aluminum. The high reflective film may be composed of a dielectric multilayer film. The protective film can be a film for physically or chemically protecting these films.

Thin film 32 functions as a base layer for forming phosphor layer 40. When matrix 41 of phosphor layer 40 is crystalline, thin film 32 functions as a seed crystal in a crystal growth process of matrix 41. That is, thin film 32 is a single crystal thin film or a polycrystalline thin film. When matrix 41 is composed of a single crystal of ZnO or a polycrystal of ZnO, thin film 32 can be a single crystal thin film of ZnO or a polycrystalline thin film of ZnO. However, thin film 32 may be omitted if substrate body 31 can exhibit a function of the seed crystal. For example, when substrate body 31 is composed of crystalline GaN or crystalline ZnO, matrix 41 composed of crystalline ZnO can be formed directly on substrate body 31. Further, thin film 32 may be omitted also when matrix 41 is not crystalline.

In phosphor layer 40, phosphor particles 42 are dispersed in matrix 41. In FIG. 1, phosphor particles 42 are separated from one another. However, phosphor particles 42 may be in contact with one another. Phosphor particles 42 may be stacked on one another as in a stone wall.

Phosphor particles 42 receive excitation light and emit fluorescence. Phosphor particles 42 include at least one selected from the group consisting of metal oxides represented by the following formula (1) and metal oxides represented by the following formula (2).

$$Y_{3-x1-y1}R^1_{y1}Ce_{x1}Al_{5-z1}Ga_{z1}O_{12} \qquad (1)$$

$$Y_{3-x2-y2}R^2_{y2}Ce_{x2}Al_{5-z2}Sc_{z2}O_{12} \qquad (2)$$

In the formula (1), $R^1$ includes at least one selected from the group consisting of Gd and Tb, and $x_1$, $y_1$, and $z_1$ satisfy $0.003 \le x_1 \le 0.03$, $0 \le y_1 \le 2.1$, and $0 \le z_1 \le 2.2$, respectively. In the formula (2), $R^2$ includes at least one selected from the group consisting of Gd and Tb, and $x_2$, $y_2$ and $z_2$ satisfy $0.003 \le x_2 \le 0.03$, $0 \le y_2 \le 2.1$, and $0 \le z_2 \le 1.5$, respectively.

In the present description, the metal oxides represented by the formula (1) are sometimes called "metal oxides A". The metal oxides represented by the formula (2) are sometimes called "metal oxides B". Each of the metal oxides A and the metal oxides B has, for example, a garnet-type crystal structure. Phosphor particles 42 may contain, as a main component, at least one selected from the group consisting of the metal oxides A and the metal oxides B. The "main component" means a component contained most in phosphor particles 42 in terms of weight ratio. Phosphor particles 42 may be substantially composed of at least one selected from the group consisting of the metal oxides A and the metal oxides B. "Be substantially composed of" means elimination of other components which change essential characteristics of the mentioned metal oxides. Phosphor particles 42 may be substantially composed of the metal oxides A or may be substantially composed of the metal oxides B. However, phosphor particles 42 may contain impurities in addition to the metal oxides A and the metal oxides B.

In the formula (1), $R^1$ may be composed of Gd, or may be composed of Tb. In the formula (2), $R^2$ may be composed of Gd, or may be composed of Tb.

In the formula (1), $x_1$ may be 0.010 or more, or may be 0.015 or more. In the formula (1), $x_1$ may be 0.024 or less, may be 0.023 or less, or may be 0.021 or less. In the formula (1), $x_1$ may satisfy $0.003 \le x_1 \le 0.024$.

In the formula (2), $x_2$ may be 0.010 or more, or may be 0.015 or more. In the formula (2), $x_2$ may be 0.024 or less, may be 0.023 or less, or may be 0.021 or less. In the formula (2), $x_2$ may satisfy $0.003 \leq x_2 \leq 0.024$.

In the metal oxides A and the metal oxides B, the Ce atoms function as light emission centers. Since each of $x_1$ and $x_2$ is 0.003 or more in the formulas (1) and (2), phosphor particles 42 can sufficiently absorb the excitation light. Therefore, phosphor particles 42 exhibit high internal quantum efficiency.

In the formulas (1) and (2), each of $x_1$ and $x_2$ is 0.03 or less. Accordingly even when phosphor particles 42 are irradiated with excitation light having an energy density of 10 W/mm² or more, density of excited Ce atoms is low in phosphor particles 42. Thus, a probability that the excited Ce atoms absorb fluorescent light emitted from other Ce atoms is low. That is, the excited Ce atoms are suppressed from being further excited to an energy level that does not contribute to the emission of the fluorescent light. Thus, the internal quantum efficiency of phosphor particles 42 can be suppressed from decreasing.

In the formula (1), $y_1$ may be 0.06 or more, may be 0.10 or more, may be 0.24 or more, or may be 0.30 or more. In the formula (1), y may be 1.80 or less. In the formula (1), $y_1$ may satisfy $0.1 \leq y_1 \leq 2.1$.

In the formula (2), $y_2$ may be 0.06 or more, may be 0.10 or more, may be 0.24 or more, or may be 0.30 or more. In the formula (2), $y_2$ may be 1.80 or less. In the formula (2), $y_2$ may satisfy $0.1 \leq y_2 \leq 2.1$.

When the metal oxides A or the metal oxides B contain Gd atoms or Tb atoms, phosphor particles 42 can emit fluorescent light having a long peak wavelength. Each of $y_1$ and $y_2$ is appropriately adjusted in the formulas (1) and (2), whereby fluorescent light having a desired peak wavelength can be obtained.

The Gd atoms and the Tb atoms sometimes reduce the internal quantum efficiency of phosphor particles 42. Since each of $y_1$ and $y_2$ is 2.1 or less in the formulas (1) and (2), phosphor particles 42 exhibit sufficiently high internal quantum efficiency. Moreover, the Gd atoms and the Tb atoms sometimes reduce temperature characteristics of phosphor particles 42. The temperature characteristics mean characteristics that the internal quantum efficiency of the phosphor particles decreases as the temperature of the phosphor particles increases. When the temperature characteristics of phosphor particles 42 are not sufficient, it is necessary to suppress the temperature increase of phosphor particles 42. In order to suppress the temperature increase of phosphor particles 42, a material having excellent heat dissipation may be used as a material of matrix 41.

In the formula (1), $z_1$ may be 0.1 or more, may be 0.5 or more, or may be 1.0 or more. In the formula (1), $z_1$ may be 2.0 or less. In the formula (1), $z_1$ may satisfy $0.1 \leq z_1 \leq 2.2$.

In the formula (2), $z_2$ may be 0.1 or more, may be 0.5 or more, or may be 1.0 or more. In the formula (2), $z_2$ may satisfy $0.1 \leq z_2 \leq 1.5$.

When the metal oxides A contain Ga atoms, or when the metal oxides B contain Sc atoms, phosphor particles 42 have a short fluorescence lifetime. "Fluorescence lifetime" means a time required for phosphor particles 42 excited by absorbing the excitation light to return to the ground state. In other words, the fluorescence lifetime means a time required for the intensity of the fluorescent light emitted from phosphor particles 42 to decrease to 1/e of a maximum value thereof. When phosphor particles 42 have a short fluorescence lifetime, a time from the excitation of the Ce atoms by the excitation light to the emission of the fluorescent light is short. Therefore, the probability that the excited Ce atoms absorb the fluorescent light emitted from the other Ce atoms is low. Thus, even when phosphor particles 42 are irradiated with excitation light having an energy density of 10 W/mm² or more, the internal quantum efficiency of phosphor particles 42 can be further suppressed from decreasing.

The Ga atoms and the Sc atoms sometimes reduce the internal quantum efficiency of phosphor particles 42. Furthermore, when the metal oxides A contain the Ga atoms, or when the metal oxides B contain the Sc atoms, phosphor particles 42 sometimes emit phosphorescent light. The lifetime of phosphorescence is longer than the fluorescence lifetime. Therefore, when phosphor particles 42 emit the phosphorescent light, the internal quantum efficiency of phosphor particles 42 sometimes further decrease. In the formula (1), $z_1$ is 2.2 or less, and further, in the formula (2), $z_2$ is 1.5 or less. Therefore, phosphor particles 42 exhibit sufficiently high internal quantum efficiency. Phosphor particles 42 hardly emit the phosphorescent light.

That is, in order to suppress the internal quantum efficiency of phosphor particles 42 from decreasing, $0.1 \leq z_1 \leq 2.2$ is preferable in the formula (1). $0.5 \leq z_1 \leq 2.0$ is more preferable, and $1.0 \leq z_1 \leq 2.0$ is still more preferable.

Moreover, in order to suppress the internal quantum efficiency of phosphor particles 42 from decreasing, $0.1 \leq z_2 \leq 1.5$ is preferable in the formula (2). $0.5 \leq z_2 \leq 1.5$ is more preferable, and $1.0 \leq z_2 \leq 1.5$ is still more preferable.

When the metal oxides A contain the Ga atoms, or when the metal oxides B contain the Sc atoms, phosphor particles 42 can emit fluorescent light having a short peak wavelength. Each of $z_1$ and $z_2$ is appropriately adjusted in the formulas (1) and (2), whereby the fluorescent light having a desired peak wavelength can be obtained.

By the following method, it can be determined whether or not phosphor particles 42 contain at least one selected from the group consisting of the metal oxides A and the metal oxides B. First, positions of phosphor particles 42 exposed from the cross section of wavelength conversion member 20 are specified. The composition of phosphor particles 42 is specified by performing elemental analysis for these phosphor particles 42. Based on the composition of phosphor particles 42, it can be determined whether or not phosphor particles 42 contain at least one selected from the group consisting of the metal oxides A and the metal oxides B. The elemental analysis can be performed, for example, by an electron probe microanalyzer. The composition of phosphor particles 42 may be an average of the respective compositions of any number (for example, 10) of phosphor particles 42.

An average particle size of phosphor particles 42 may be in a range of 0.1 μm to 100 μm, or may be in a range of 0.1 μm to 50 μm. The average particle size of phosphor particles 42 can be specified by, for example, the following method. First, a cross section of wavelength conversion member 20 is observed by a scanning electron microscope. In an obtained electron microscope image, an area of phosphor particle 42 that is specific is calculated by image processing. A diameter of a circle having the same area as the calculated area is regarded as a particle size (particle diameter) of specific phosphor particle 42. Particle sizes of any number (for example, 50) of phosphor particles 42 are individually calculated, and an average value of calculated values is regarded as the average particle size of phosphor particles 42. In the present disclosure, a method for measuring the average particle size is not limited to the above method. The average particle size of phosphor particles 42 may be a particle size (median diameter or D50) at which a cumulative volume percentage corresponds to 50% in a particle size distribution measured by a laser diffraction/scattering-type particle size/particle size distribution measuring device. In the present disclosure, a shape of phosphor particles 42 is not limited. The shape of phosphor particles 42 may be spherical, may be scaly or may be fibrous. A content of phosphor particles 42 in phosphor layer 40 is not particularly limited, but is, for example, in a range of 10 vol % to 75 vol %. Here, vol % refers to the volume percentage.

Phosphor particles 42 exhibit sufficiently high internal quantum efficiency. When the energy density of the excitation light is 0.1 W/mm$^2$, the internal quantum efficiency of phosphor particles 42 may be 85% or more, or may be 90% or more. An upper limit of the internal quantum efficiency of phosphor particles 42 under this condition is not particularly limited, but is, for example, 99%. The internal quantum efficiency of phosphor particles 42 can be measured by, for example, a commercially available absolute PL quantum yield measuring device.

Phosphor particles 42 exhibit a high retention rate for the internal quantum efficiency. The retention rate of the internal quantum efficiency of phosphor particles 42 represents a degree of the decrease in the internal quantum efficiency of phosphor particles 42 when phosphor particles 42 are irradiated with excitation light having a high energy density. The retention rate R (%) of the internal quantum efficiency of phosphor particles 42 can be calculated by the following equation (3).

$$R(\%)=\eta(E^1)/\eta(E^2)\times 100 \quad (3)$$

In the equation (3), $\eta(E^1)$ indicates internal quantum efficiency of phosphor particles 42 when phosphor particles 42 are irradiated with excitation light having an energy density of $E^1$ (W/mm$^2$). $\eta(E^2)$ indicates internal quantum efficiency of phosphor particles 42 when phosphor particles 42 are irradiated with excitation light having an energy density of $E^2$ (W/mm$^2$). However, $E^1$ and $E^2$ satisfy $E^1>E^2$.

When $E^1$ is 100 W/mm$^2$ and $E^2$ is 10 W/mm$^2$ in the equation (3), the retention rate R of the internal quantum efficiency of phosphor particles 42 may be 85% or more, or may be 90% or more. An upper limit of the retention rate of the internal quantum efficiency of phosphor particles 42 under this condition is not particularly limited, but is, for example, 99%.

When phosphor particles 42 satisfy a predetermined condition, a ratio P (%) of detection efficiency DE calculated by the following equation (4) can also be regarded as such a retention rate R (%) of the internal quantum efficiency of phosphor particles 42.

$$P(\%)=DE(E^1)/DE(E^2)\times 100 \quad (4)$$

In the equation (4), $DE(E^1)$ indicates detection efficiency of fluorescent light emitted from phosphor particles 42 when phosphor particles 42 are irradiated with the excitation light having an energy density of $E^1$ (W/mm$^2$). Specifically the detection efficiency $DE(E^1)$ is a ratio of detection intensity of the fluorescent light to the energy density ($E^1$) of the excitation light. The detection intensity of the fluorescent light can be measured by for example, a photodetector. $DE(E^2)$ indicates detection efficiency of fluorescent light emitted from phosphor particles 42 when phosphor particles 42 are irradiated with the excitation light having an energy density of $E^2$ (W/mm$^2$). Specifically the detection efficiency $DE(E^2)$ is a ratio of detection intensity of the fluorescent light to the energy density ($E^2$) of the excitation light. As in the equation (3), $E^1$ and $E^2$ satisfy $E^1>E^2$. When the energy density of the excitation light increases from $E^2$ (W/mm$^2$) to $E^1$ (W/mm$^2$), in the case where a spectral distribution of the fluorescent light emitted from phosphor particles 42 and a probability that phosphor particles 42 absorb the excitation light hardly change, the ratio P (%) of the detection efficiency DE calculated by the equation (4) can be regarded as the retention rate R (%) of the internal quantum efficiency of phosphor particles 42.

The fluorescence lifetime of phosphor particles 42 may be 100 ns (nanoseconds) or less, may be 80 ns or less, or may be 63 ns or less. A lower limit of the fluorescence lifetime of phosphor particles 42 is not particularly limited, but is, for example, 10 ns. The fluorescence lifetime can be measured by a commercially available fluorescence lifetime measuring device.

The peak wavelength of the fluorescent light emitted by phosphor particles 42 may be 548 nm or more and 580 nm or less. Light having a peak wavelength in a range of 548 nm or more and 580 nm or less is, for example, yellow light. At this time, if the excitation light is blue light, white light can be easily obtained by mixing the excitation light and the fluorescent light with each other. The blue light is, for example, light having a wavelength of 360 nm or more and 480 nm or less. The fluorescent light emitted from phosphor particles 42 may include red light. The red light is, for example, light having a wavelength exceeding 580 nm and 750 nm or less. At this time, light source device 100 is suitable for application such as a projector. When the peak wavelength of the fluorescent light emitted by phosphor particles 42 is 548 nm or more and 580 nm or less, red light having high intensity can be obtained by using a filter or the like that transmits only light having a wavelength of 580 nm or more and 750 nm or less. Moreover, green light having high intensity can be obtained by using a filter or the like that transmits only light having a wavelength of 490 nm or more and 570 nm or less.

The Ce atoms can shift the peak wavelength of the fluorescent light emitted from phosphor particles 42 toward a longer wavelength. However, in the present exemplary embodiment, a content of the Ce atoms in the metal oxides A and the metal oxides B is low. Therefore, when y is 0 in the formulas (1) and (2), phosphor particles 42 sometimes emit yellow-green light. The yellow-green light is, for example, light having a wavelength of 520 nm or more and less than 548 nm.

As mentioned above, each of the Ce atoms, the Gd atoms, and the Tb atoms can shift, toward a longer wavelength, the peak wavelength of the fluorescent light emitted from phosphor particles 42. However, in comparison with the Ce atoms, the Gd atoms and the Tb atoms tend to reduce the temperature characteristics of phosphor particles 42. Therefore, heretofore, when it has been necessary to emit fluorescent light having a long peak wavelength from a phosphor, the content of Ce atoms in the phosphor is set to a high value. On the other hand, the content of Ce atoms in phosphor particles 42 of the present exemplary embodiment is intentionally set to a low value. Thus, even when phosphor particles 42 are irradiated with excitation light having a high energy density the internal quantum efficiency of phosphor particles 42 can be suppressed from decreasing.

Moreover, phosphor particles 42 exhibit a high retention rate for the internal quantum efficiency That is, even when the energy density of the excitation light changes, the change in the internal quantum efficiency of phosphor particles 42 is suppressed. Thus, a change in the color of the light to be emitted from light source device 100 can be suppressed.

Phosphor 840 disclosed in PTL 1 is a flat plate-shaped single crystal. When such a phosphor is irradiated with excitation light, the excitation light and fluorescent light are guided inside the phosphor. On the other hand, since phosphor particles 42 have a shape of particles, the excitation light and the fluorescent light can be suppressed from being guided inside phosphor layer 40. Therefore, according to phosphor particles 42, the light emitted from wavelength conversion member 20 can be easily condensed. Phosphor particles 42 are suitable for applications such as a projector and a vehicle headlamp.

Matrix 41 includes, for example, at least one selected from the group consisting of transparent resin, glass, transparent crystal, and inorganic material. Examples of the transparent resin include silicone resin. Examples of the silicone resin include polysilsesquioxane. Examples of the inorganic material include at least one selected from the group consisting of ZnO, $SiO_2$ and $TiO_2$.

Matrix 41 contains, for example, zinc oxide (ZnO). ZnO is suitable for the material of matrix 41 from viewpoints of transparency and thermal conductivity. ZnO has high thermal conductivity. Therefore, when ZnO is used as the material of matrix 41, heat of phosphor layer 40 can be easily released to the outside (mainly to substrate 30). Thus, an increase in the temperature of phosphor particles 42 can be suppressed. Matrix 41 may contain ZnO as a main component. Matrix 41 may be composed substantially of ZnO. However, matrix 41 may contain impurities in addition to ZnO.

Specifically, ZnO as a material of matrix 41 is a single crystal of ZnO or a polycrystal of ZnO. ZnO has a wurtzite crystal structure. When matrix 41 is formed by crystal growth, matrix 41 has, for example, a crystal structure corresponding to a crystal structure of thin film 32. That is, when a ZnO polycrystal oriented along the c-axis is used as thin film 32, matrix 41 has a ZnO polycrystal oriented along the c-axis. "ZnO oriented along the c-axis" means that a plane parallel to the main surface of substrate 30 is the c-plane. The "main surface" means a surface having a largest area. When matrix 41 contains the ZnO polycrystal oriented along the c-axis, light scattering is suppressed inside phosphor layer 40, and highlight output can be achieved.

The ZnO polycrystal oriented along the c-axis includes a plurality of columnar crystal grains oriented along the c-axis. In the ZnO polycrystal oriented along the c-axis, there are few grain boundaries in the c-axis direction. "Columnar crystal grains are oriented along the c-axis" means that the growth of ZnO in the c-axis direction is faster than the growth of ZnO in the a-axis direction, and vertically long ZnO crystal grains are formed on substrate 30. The c-axis of the ZnO crystal grains is parallel to the normal direction of substrate 30. In other words, the c-axis of the ZnO crystal grains is parallel to the normal direction of the surface of phosphor layer 40, which receives the excitation light. Whether or not ZnO is such a crystal oriented along the c-axis can be confirmed by XRD measurement (2θθ scan). In ZnO diffraction peaks obtained from an XRD measurement result, when a diffraction peak due to the c-plane of ZnO has higher intensity than diffraction peaks due to other than the c-plane of ZnO, it can be determined that ZnO is the crystal oriented along the c-axis. PTL 2 discloses in detail a matrix composed of a ZnO polycrystal oriented along the c-axis.

Phosphor layer 40 may further include filler particles. In phosphor layer 40, the filler particles are dispersed in matrix 41. When the filler particles are irradiated with excitation light, the filler particles either do not emit fluorescent light or emit only fluorescent light with negligible intensity. A material, shape and addition amount of the filler particles are appropriately adjusted according to chromaticity that is required.

The filler particles are, for example, inorganic particles, and typically contain metal oxides. The filler particles may be substantially composed of metal oxides. Many metal oxides are chemically stable and emit little fluorescence, thus making them suitable as materials for the filler particles. In one example, the filler particles include at least one selected from $Al_2O_3$ particles, $SiO_2$ particles, and $TiO_2$ particles.

An average particle size of the filler particles is, for example, in a range of 0.1 μm to 20 μm. The average particle size of the filler particles is, for example, smaller than the average particle size of phosphor particles 42. A ratio (D2/D1) of the average particle size D2 of the filler particles to the average particle size D1 of the phosphor particles 42 is, for example, in a range of 0.01 to 0.90. The average particle size of the filler particles can be measured by the same method as that for the average particle size of phosphor particles 42. A shape of the filler particles may be spherical, may be scaly or may be fibrous. A volume of phosphor particles 42 is defined as V1. A volume of filler particles is defined as V2. At this time, a value of V2/(V1+V2) is, for example, in a range of 0.1 to 0.9.

Next, a method for manufacturing wavelength conversion member 20 will be described.

First, phosphor particles 42 are produced. Phosphor particles 42 can be produced by the following method. First, as raw materials, prepared are a compound containing Y atoms, a compound containing Gd atoms, a compound containing Tb atoms, a compound containing Ce atoms, a compound containing Al atoms, a compound containing Ga atoms, and compound containing Sc atoms. The compound containing Y atoms is, for example, yttrium oxide. The compound containing Gd atoms is, for example, gadolinium oxide. The compound containing Tb atoms is, for example, terbium oxide. Examples of the compound containing Ce atoms include cerium oxide, cerium chloride, and cerium fluoride. The compound containing Al atoms is, for example, aluminum oxide. The compound containing Ga atoms is, for example, gallium oxide. The compound containing Sc atoms is, for example, scandium oxide. Shapes of these raw materials are, for example, powdery.

Next, a mixture is obtained by weighing and mixing these raw materials such that such a metal oxide A or such a metal oxide B can be obtained. Examples of a method of mixing the raw materials include a wet mixing method and a dry mixing method. Examples of a device for mixing the raw materials include a ball mill, a stirring mill, a planetary mill, a vibration mill, a jet mill, and a V-type mixer. The mixture may contain a flux in addition to the above raw materials. Examples of the flux include barium fluoride.

Next, the mixture is fired, whereby phosphor particles 42 are obtained. The firing is performed, for example, in a nitrogen atmosphere or in an atmosphere of a mixed gas of nitrogen and hydrogen. The firing may be performed under pressurized conditions. Temperature of the firing may be in a range of 1300° C. to 1800° C., or may be in a range of 1500° C. to 1700° C. Time of the firing is, for example, 1 to 50 hours.

Phosphor particles 42 thus obtained may be subjected to cleaning treatment. For the cleaning treatment, for example, acid or water is used. The acid is, for example, an acid aqueous solution. The acid aqueous solution is, for example, a nitric acid aqueous solution. After the cleaning treatment with acid, cleaning treatment with water may be performed. The flux can be removed by performing the cleaning treatment for phosphor particles 42. Further, if necessary the average particle size of phosphor particles 42 may be adjusted by pulverizing phosphor particles 42. A pulverizer such as a ball mill and a jet mill can be used for pulverizing phosphor particles 42. Further, if necessary the particle size distribution of phosphor particles 42 may be adjusted by classifying phosphor particles 42. A classifier such as a dry classifier and a wet classifier can be used for classifying phosphor particles 42. For the classification of phosphor particles 42, there may be used: a method of sieving phosphor particles 42 using a mesh made or nylon or the like; a method of removing fine particles of phosphor particles 42, which have a particle size smaller than a specific particle size, by elutriation; and the like.

Next, substrate 30 is prepared. For example, a crystalline ZnO thin film is formed as thin film 32 on substrate body 31. As a method for forming the ZnO thin film, there is used a vapor deposition method such as an evaporation method, an electron beam evaporation method, a reactive plasma evaporation method, an ion-assisted evaporation method, a sputtering method, and a pulse laser deposition method. Thin film 32 may be formed by the following method. First, sol containing a precursor of zinc alkoxide or the like is prepared. The sol is applied to substrate body 31 by a printing method to form a coating film. Next, the coating film is subjected to heat treatment, whereby thin film 32 is obtained. Thin film 32 can be a ZnO single crystal thin film or a ZnO polycrystalline thin film.

Next, phosphor layer 40 is produced on substrate 30 (on thin film 32). When matrix 41 contains transparent resin, phosphor layer 40 can be produced by the following method. First, a dispersion liquid containing the transparent resin and phosphor particles 42 is prepared. A coating film is obtained by applying the dispersion liquid onto substrate 30. The coating film is dried, or the transparent resin is cured by being heated or irradiated with ultraviolet rays, whereby phosphor layer 40 is obtained.

When matrix 41 contains glass, phosphor layer 40 can be produced by the following method. First, sol containing a precursor of silicon alkoxide or the like is prepared. Phosphor particles 42 are dispersed in the sol. The sol is applied onto substrate 30. The sol is gelled and fired. Thus, phosphor layer 40 is obtained.

When matrix 41 contains zinc oxide, phosphor layer 40 can be produced by the following method. First, a layer containing phosphor particles 42 is formed. For example, a dispersion liquid containing phosphor particles 42 is prepared. Substrate 30 is placed in the dispersion liquid, and phosphor particles 42 are deposited on substrate 30 using electrophoresis. Thus, a layer containing phosphor particles 42 can be formed on substrate 30. Substrate 30 is placed in the dispersion liquid, and phosphor particles 42 are precipitated, whereby the layer containing phosphor particles 42 can also be formed on substrate 30. The layer containing phosphor particles 42 can also be formed on substrate 30 using a coating liquid containing phosphor particles 42 and by a thin film forming method such as a printing method.

Next, matrix 41 is formed between a plurality of phosphor particles 42. As a method for forming matrix 41, a solution growth method using a solution containing Zn ions can be used. As the solution growth method, there are used: chemical bath deposition performed under the atmospheric pressure; hydrothermal synthesis performed under the atmospheric pressure or higher; electrochemical deposition that applies a voltage or current; and the like. As a solution for the crystal growth, for example, an aqueous solution of zinc nitrate, which contains hexamethylenetetramine, is used. Crystalline matrix 41 grows epitaxially on thin film 32. Thus, phosphor layer 40 is obtained. Details of the solution growth method are disclosed in PTL 3.

(Modified Example of Light Source Device)

Figure 2:
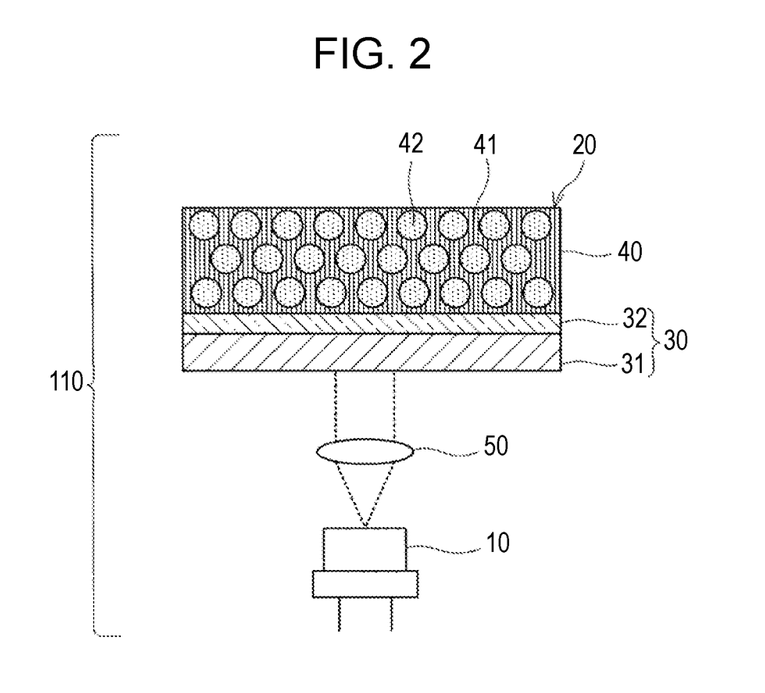
FIG. 2 is a schematic cross-sectional view of a light source device according to a modified example of the present disclosure.

Phosphor layer 40 does not have to be located between excitation light source 10 and substrate 30 of wavelength conversion member 20. In light source device 110 of FIG. 2, excitation light source 10 faces substrate 30 of wavelength conversion member 20. In light source device 110, substrate 30 has translucency to excitation light. The excitation light passes through substrate 30 and reaches phosphor layer 40. Light source device 110 is a transmissive light source.

(Another Modified Example of Light Source Device)

Figure 3:
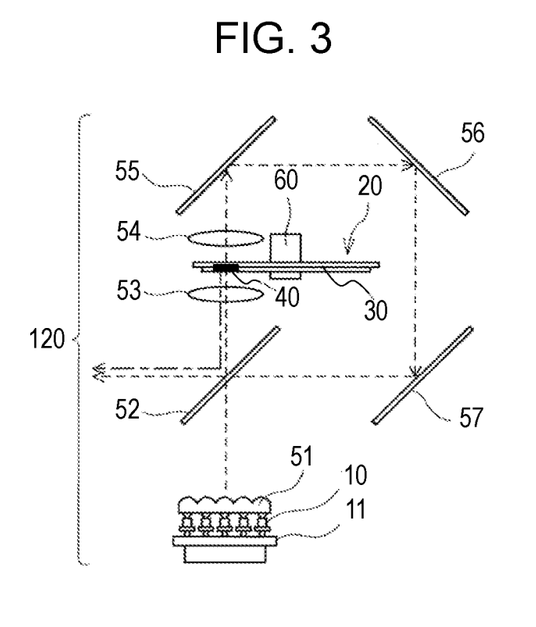
FIG. 3 is a schematic configuration diagram of a light source device according to another modified example of the present disclosure.

As illustrated in FIG. 3, light source device 120 of the present exemplary embodiment includes a plurality of excitation light sources 10 and wavelength conversion member 20. In FIG. 3, phosphor layer 40 of wavelength conversion member 20 is located between each of the plurality of excitation light sources 10 and substrate 30 of wavelength conversion member 20. Each of the plurality of excitation light sources 10 faces phosphor layer 40 of wavelength conversion member 20. Light source device 120 is suitable for application such as a projector.

Figure 4:
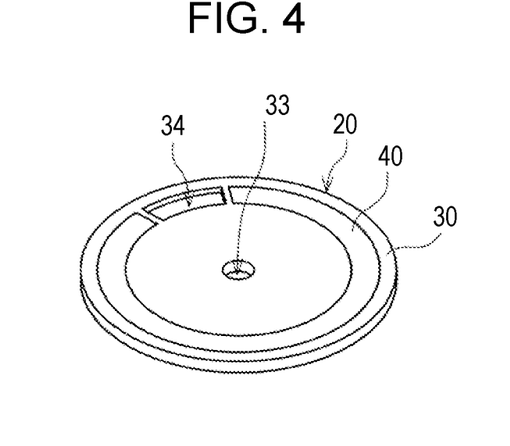
FIG. 4 is a perspective view of a wavelength conversion member included in the light source device illustrated in FIG. 3.

As illustrated in FIG. 4, substrate 30 of wavelength conversion member 20 of light source device 120 has a disc shape. Substrate 30 has through hole 33 and translucent portion 34. Through hole 33 extends in a thickness direction of substrate 30. Through hole 33 is located at the center of a virtual circle defined by, for example, the outer peripheral surface of substrate 30. Translucent portion 34 has a circular arc shape. Translucent portion 34 may be in contact with phosphor layer 40. Translucent portion 34 is, for example, a through hole. Translucent portion 34 may be made of transparent resin or glass. Translucent portion 34 may be made of a translucent material such as sapphire or quartz.

Phosphor layer 40 has a circular arc shape. Phosphor layer 40 and translucent portion 34 are arranged along the virtual circle defined by the outer peripheral surface of phosphor layer 40. Phosphor layer 40 partially coats the main surface of substrate 30. In light source device 120, wavelength conversion member 20 may include a plurality of phosphor layers 40. The plurality of phosphor layers 40 may be arranged along a virtual circle defined by an outer peripheral surface of phosphor layer 40 that is specific. Phosphor particles 42 contained in the plurality of phosphor layers 40 may have different compositions from one another.

As illustrated in FIG. 3, light source device 120 further includes motor 60. Wavelength conversion member 20 is placed on motor 60. Specifically a shaft of motor 60 is inserted into through hole 33 of substrate 30. Wavelength conversion member 20 is fixed to motor 60 by, for example, a fixing member such as a screw. Wavelength conversion member 20 is rotated by motor 60, and excitation light emitted from the plurality of excitation light sources 10 is applied to wavelength conversion member 20. Thus, the excitation light can be prevented from being partially applied to phosphor layer 40. Therefore, the temperature of phosphor layer 40 can be prevented from increasing due to the excitation light and the fluorescent light.

Light source device 120 further includes collimating lens 51, dichroic mirror 52, lenses 53 and 54, and reflective mirrors 55, 56 and 57. Collimating lens 51, dichroic mirror 52, and lens 53 are located between the plurality of excitation light sources 10 and wavelength conversion member 20. Collimating lens 51, dichroic mirror 52, and lens 53 are arranged in this order on an optical path of the excitation light emitted from the plurality of excitation light sources 10. Lens 54, reflective mirrors 55, 56 and 57, and dichroic mirror 52 are arranged in this order on an optical path of the excitation light that has passed through wavelength conversion member 20.

Collimating lens 51 condenses the excitation light emitted from the plurality of excitation light sources 10. According to collimating lens 51, parallel light is obtained. Dichroic mirror 52 can pass the excitation light therethrough, and can efficiently reflect the light emitted from wavelength conversion member 20. Lens 53 condenses the excitation light and the light emitted from wavelength conversion member 20. Lens 54 condenses the excitation light that has passed through wavelength conversion member 20. According to lens 54, parallel light is obtained. Each of reflective mirrors 55, 56 and 57 reflects the excitation light.

Light source device 120 further includes heat sink 11. Heat sink 11 is in contact with each of the plurality of excitation light sources 10. According to heat sink 11, heat of the plurality of excitation light sources 10 can be easily released to the outside. Thus, the temperature of the plurality of excitation light sources 10 can be prevented from increasing, and accordingly energy conversion efficiency in the plurality of excitation light sources 10 can be suppressed from decreasing.

Next, operations of light source device 120 will be described.

First, the plurality of excitation light sources 10 emit excitation light. The excitation light is condensed by collimating lens 51, and is converted into parallel light. Next, the excitation light passes through dichroic mirror 52, and is further condensed by lens 53. According to lens 53, the spot diameter of the excitation light to enter phosphor layer 40 can be adjusted. Next, the excitation light enters wavelength conversion member 20. Wavelength conversion member 20 is rotated by motor 60. Therefore, the operation of light source device 120 includes a period in which the excitation light enters phosphor layer 40 and a period in which the excitation light passes through translucent portion 34. When the excitation light enters phosphor layer 40, wavelength conversion member 20 emits light having a wavelength longer than the wavelength of the excitation light. The light emitted from wavelength conversion member 20 is condensed by lens 53, and is converted into parallel light. The light emitted from wavelength conversion member 20 is reflected by dichroic mirror 52, and is sent to the outside of light source device 120.

When the excitation light passes through translucent portion 34, the excitation light is condensed by lens 54, and is converted into parallel light. The excitation light that has passed through lens 54 is reflected by reflective mirrors 55, 56 and 57. Next, the excitation light passes through dichroic mirror 52. Thus, the excitation light is sent to the outside of light source device 120. At this time, the excitation light is mixed with the light emitted from wavelength conversion member 20.

Exemplary Embodiment of Projector

Figure 5:
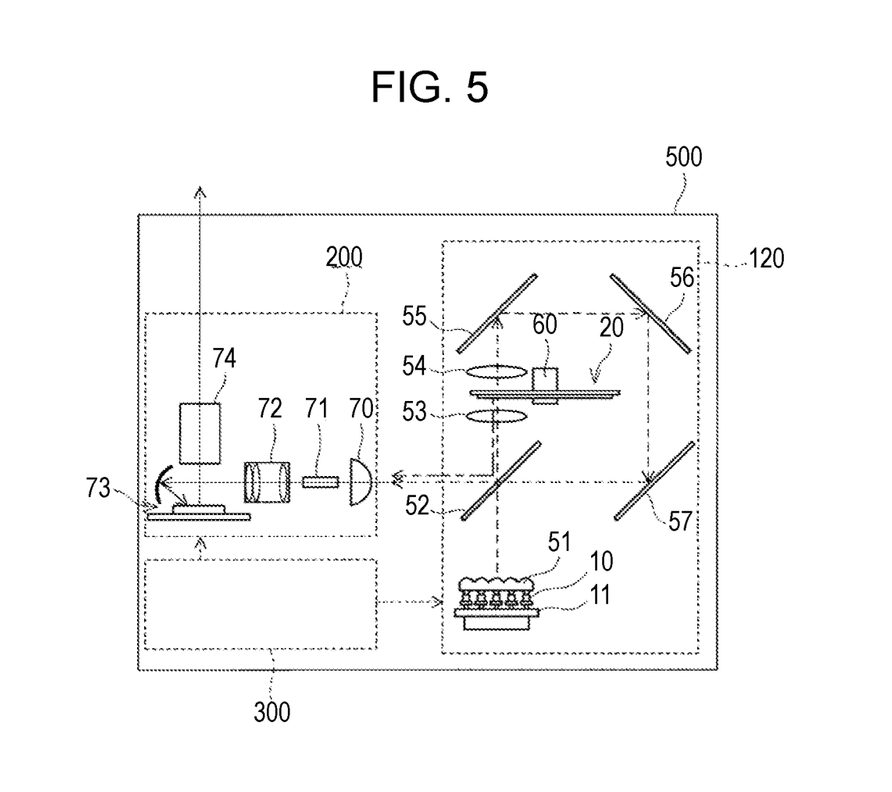
FIG. 5 is a schematic configuration diagram of a projector using the light source device of the present disclosure.

As illustrated in FIG. 5, projector 500 of the present exemplary embodiment includes light source device 120, optical unit 200, and controller 300. Optical unit 200 converts the light emitted from light source device 120, and projects an image or a video onto an object located outside of projector 500. The object includes, for example, a screen. Optical unit 200 includes condenser lens 70, rod integrator 71, lens unit 72, display element 73, and projection lens 74.

Condenser lens 70 condenses the light emitted from light source device 120. Thus, the light emitted from light source device 120 is condensed on an incident end surface of rod integrator 71.

Rod integrator 71 has, for example, a quadrangular prism shape. The light that has entered rod integrator 71 repeats total internal reflection in rod integrator 71, and is emitted from an emission end surface of rod integrator 71. The light emitted from rod integrator 71 has a uniform brightness distribution.

Lens unit 72 has a plurality of lenses. Examples of the plurality of lenses included in lens unit 72 include a condenser lens and a relay lens. Lens unit 72 guides the light, which is emitted from rod integrator 71, to display element 73.

Display element 73 converts the light that has passed through lens unit 72. Thus, an image or video to be projected onto the object located outside of projector 500 is obtained. Display element 73 is, for example, a digital mirror device (DMD).

Projection lens 74 projects the light, which is converted by display element 73, to the outside of projector 500. Thus, the light converted by display element 73 can be projected onto the object. Projection lens 74 has one or more lenses. Examples of the lenses included in projection lens 74 include a biconvex lens and a plano-concave lens.

Controller 300 controls each unit of light source device 120 and optical unit 200. Controller 300 is, for example, a microcomputer or a processor.

Figure 6:
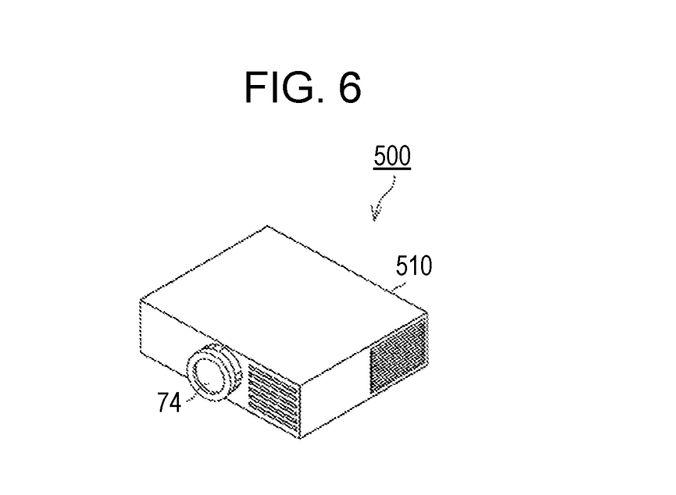
FIG. 6 is a perspective view of the projector illustrated in FIG. 5.

As illustrated in FIG. 6, projector 500 further includes housing 510. Housing 510 houses light source device 120, optical unit 200, and controller 300. Apart of projection lens 74 of the optical unit 200 is exposed to the outside of housing 510.

According to light source device 120, light having high brightness can be efficiently obtained. Therefore, projector 500 can efficiently project light having high brightness. According to light source device 120, a number of excitation light sources required can be reduced as compared with a conventional projector. Power consumption of projector 500 is lower than that of a conventional projector. According to light source device 120, the projector can be miniaturized.

Exemplary Embodiment of Vehicle Headlamp

Figure 7:
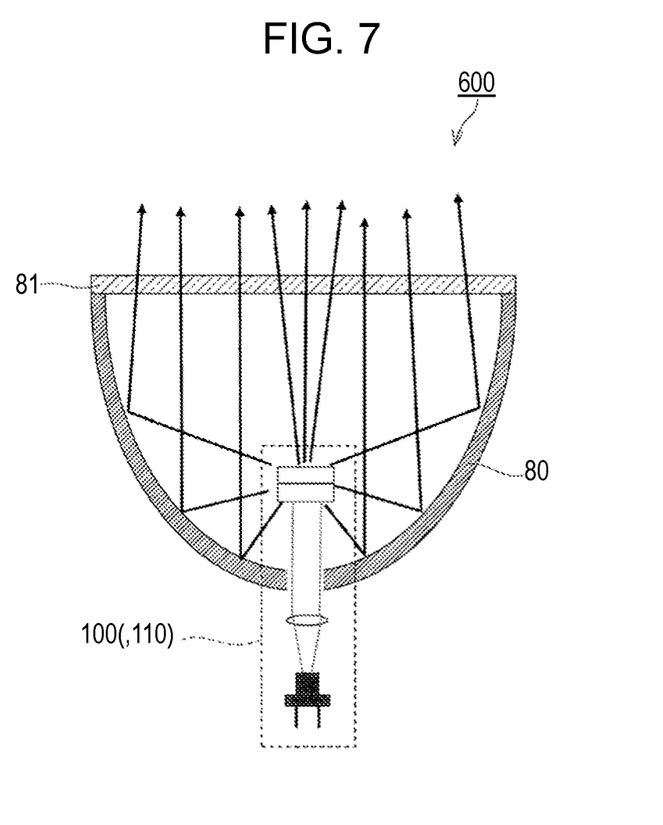
FIG. 7 is a schematic configuration diagram of a vehicle headlamp using the light source device of the present disclosure.

As illustrated in FIG. 7, vehicle headlamp 600 of the present exemplary embodiment includes light source device 100 and optical component 80. Instead of light source device 100, light source device 110 described with reference to FIG. 2 can also be used. Examples of a vehicle include an automobile, a railroad vehicle, a streetcar, a two-wheeler, and a special vehicle. Examples of the automobile include an engine vehicle, an electric vehicle, and a hybrid vehicle. Examples of the two-wheeler include a motorcycle. Examples of the special vehicle include a construction vehicle and an agricultural vehicle. Optical component 80 is a component for guiding light emitted from light source device 100 forward, and specifically is a reflector. Optical component 80 includes, for example, a film of metal such as Al and Ag, or an Al film having a protective film formed on a surface thereof. Filter 81 may be provided in front of light source device 100. Filter 81 absorbs or scatters blue light such that coherent blue light from the excitation light source of light source device 100 does not come out directly to the outside. Vehicle headlamp 600 may be of a so-called reflector type or a projector type.

Exemplary Embodiment of Vehicle

Figure 8:
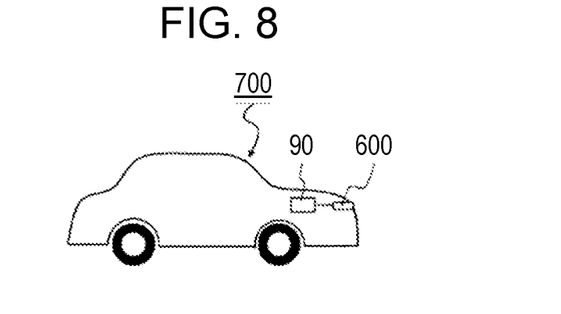
FIG. 8 is a schematic configuration diagram of a vehicle using the vehicle headlamp of the present disclosure.

As illustrated in FIG. 8, vehicle 700 of the present exemplary embodiment includes vehicle headlamp 600 and power supply source 90. Each of vehicle headlamp 600 and power supply source 90 is placed in a front portion of vehicle 700. Power supply source 90 is electrically connected to vehicle headlamp 600. Power supply source 90 includes, for example, an electric circuit and a generator that is rotationally driven by a drive source such as an engine to generate electric power. The electric circuit includes, for example, a battery or a capacitor.

According to light source device 100, light having high brightness can be efficiently obtained. Therefore, vehicle headlamp 600 of vehicle 700 can efficiently apply light having high brightness. According to the light emitted from vehicle headlamp 600, an object present at a position away from vehicle headlamp 600 can be irradiated with ease. Power consumption of vehicle headlamp 600 is lower than that of a conventional headlamp.

EXAMPLES

The present disclosure will be specifically described based on examples. However, the present disclosure is not limited to the following examples.

Comparative Example 1

[Phosphor Particles]

First, powdery yttrium oxide, powdery gadolinium oxide, powdery cerium oxide, powdery aluminum oxide, and powdery gallium oxide were weighed such that a metal oxide could be obtained, which was represented by a composition formula $Y_{3-x_1-y_1}Gd_{y_1}Ce_{x_1}Al_{5-z_1}Ga_{z_1}O_{12}$, in which each of $x_1$, $y_1$, and $z_1$ satisfied a value shown in Table 1. A powdery mixture was obtained by mixing these raw materials and barium fluoride with each other.

Next, the mixture was put into an alumina-made crucible. The mixture was fired in the crucible. The firing was performed in an atmosphere of a mixed gas of nitrogen and hydrogen. Firing temperature was in a range of 1500° C. to 1700° C. Firing time was 16 hours.

Next, a fired product thus obtained was washed with acid. As the acid, a 1 mol/L (L represents liter) nitric acid aqueous solution was used. Next, the fired product was washed with water. Thus, phosphor particles of Comparative example 1 were obtained. The phosphor particles of Comparative example 1 were made of a metal oxide represented by $Y_{2.964}Ce_{0.036}Al_5O_{12}$. The phosphor particles of Comparative example 1 had an average particle size of approximately 10 µm.

[Wavelength Conversion Member]

Next, a wavelength conversion member including the phosphor particles of Comparative example 1 was produced. First, a crystalline ZnO thin film was formed on a substrate body. A commercially available Ag mirror was used as the substrate body. The phosphor particles of Comparative example 1 were placed on the ZnO thin film. Next, a crystalline ZnO matrix was produced on the ZnO thin film by the solution growth method. As a solution for the crystal growth, an aqueous solution of zinc nitrate, which contained hexamethylenetetramine, was used. A concentration of the hexamethylenetetramine in the aqueous solution was 0.10 mol/L. A concentration of the zinc nitrate in the aqueous solution was 0.10 mol/L. In this way, the wavelength conversion member of Comparative example 1 was obtained.

Examples 1 to 16 and Comparative Examples 2 and 3

Phosphor particles of Examples 1 to 16 and Comparative Examples 2 and 3 and wavelength conversion members of Examples 1 to 16 and Comparative Examples 2 and 3 were obtained by the same method as in Comparative example 1 except that raw materials were weighed such that metal oxides were obtained in which each of $x_1$, $y_1$, and $z_1$ satisfied values shown in Table 1.

Example 17

Phosphor particles of Example 17 and a wavelength conversion member of Example 17 were obtained by the same method as in Comparative example 1 except that raw materials were weighed such that a metal oxide was obtained, in which $x_1$ was 0.014, y was 0.60, and $z_1$ was 0 in a composition formula $Y_{3-x_1-y_1}Gd_{y_1}Ce_{x_1}Al_{5-z_1}Ga_{z_1}O_{12}$.

<Peak Wavelength and Internal Quantum Efficiency>

A peak wavelength of fluorescent light and internal quantum efficiency (IQE) were measured for the phosphor particles of each of Examples 1 to 16 and Comparative examples 1 to 3. An absolute PL quantum yield measuring device (C9920-02G manufactured by Hamamatsu Photonics K.K.) was used for measuring the peak wavelength and the IQE. The measuring device was set such that excitation light emitted from the measuring device had a peak wavelength of 450 nm. From specifications of the measuring device, it was able to be confirmed that an energy density of the excitation light was 0.1 W/mm² or less. Results are shown in Table 1.

In Table 1, phosphor particles which emitted light having a peak wavelength of 548 nm or more were evaluated to have good (○) characteristics. Phosphor particles which emitted light having a peak wavelength of less than 548 nm were evaluated to having somewhat good (Δ) characteristics.

In Table 1, phosphor particles which exhibited IQE of 90% or more were evaluated to have particularly good (⊚) characteristics. Phosphor particles which exhibited IQE of 85% or more and less than 90% were evaluated to have good (○) characteristics. Phosphor particles which exhibited IQE of less than 85% were evaluated to have poor (x) characteristics.

<Fluorescence Lifetime>

A fluorescence lifetime was measured for the phosphor particles of each of Examples 1 to 16 and Comparative examples 1 to 3. A fluorescence lifetime measuring device (C11367 manufactured by Hamamatsu Photonics K.K.) was used to measure the fluorescence lifetime. The fluorescence lifetime was measured while taking as a reference the peak wavelength of the light emitted from the phosphor particles. Results are shown in Table 1. However, the phosphor particles of Comparative example 3 emitted phosphorescent light together with fluorescent light. Therefore, an accurate fluorescence lifetime of the phosphor particles in Comparative example 3 was not able to be measured.

<Retention Rate of Internal Quantum Efficiency>

A retention rate of the internal quantum efficiency (IQE) of the phosphor particles was measured using the wavelength conversion member of each of Examples 1 to 16 and Comparative examples 1 to 3. An evaluation system provided with a laser light source, a lens, a filter, and a photodetector was used to measure the retention rate of the IQE. The laser light source emitted, as excitation light, pulsed light having a wavelength of 450 nm. The filter absorbed light having a wavelength of 460 nm or less. The filter and the photodetector were placed at positions where the excitation light is not prevented from reaching the wavelength conversion member. The following operations were performed using this evaluation system. First, the excitation light was emitted from the laser light source. The excitation light was condensed by the lens, and entered the wavelength conversion member. Thus, light was emitted from the wavelength conversion member. The light emitted from the wavelength conversion member entered the filter. Light that passed through the filter entered the photodetector. Thus, intensity of the fluorescent light emitted from the wavelength conversion member was detected in the photodetector.

The retention rate of the IQE was measured by the following method. First, the phosphor layer of the wavelength conversion member was irradiated with excitation light having an energy density of 10 W/mm². The excitation light was a rectangular pulsed light with a wavelength of 100 μs (microseconds). A pulse period of the excitation light was 20 Hz. Next, detection intensity of the fluorescent light emitted from the wavelength conversion member was measured by the photodetector. Detection efficiency (DE(10)) of the fluorescent light emitted from the phosphor particles was obtained by dividing the obtained detection intensity by the energy density of the excitation light. Next, the phosphor layer of the wavelength conversion member was irradiated with excitation light having an energy density of 100 W/mm². The excitation light was rectangular pulsed light with a wavelength of 100 μs. A pulse period of the excitation light was 20 Hz. Next, detection intensity of the fluorescent light emitted from the wavelength conversion member was measured by the photodetector. Detection efficiency (DE(100)) of the fluorescent light emitted from the phosphor particles was obtained by dividing the obtained detection intensity by the energy density of the excitation light. When the energy density of the excitation light increased from 10 (W/mm²) to 100 (W/mm²), a spectral distribution of the fluorescent light emitted from the phosphor particles and a probability that the phosphor particles absorbed the excitation light hardly changed. Next, a ratio P of the detection efficiencies DE was calculated based on the following equation. The ratio P of the detection efficiencies DE was regarded as the retention rate P (%) of the IQE. Results are shown in Table 1.

$$P(\%) = DE(100)/DE(10) \times 100$$

The energy density of the excitation light was specified by the following method using the above evaluation system. First, a beam profiler was placed at a position where the wavelength conversion member should be placed. The laser light source of the evaluation system was caused to emit excitation light therefrom. With the beam profiler, an area of a range where irradiation intensity of the excitation light was $1/e^2$ or more of peak intensity thereof was specified. Output energy of the laser light source was divided by the specified area of the range. Thus, the energy density of the excitation light was specified.

In Table 1, phosphor particles which exhibited an IQE retention rate of 90% or more were evaluated to have particularly good (⊚) characteristics. Phosphor particles which exhibited an IQE retention rate of 85% or more and less than 90% were evaluated to have good (○) characteristics. Phosphor particles which exhibited an IQE retention rate of less than 85% were evaluated to have poor (x) characteristics.

Figure 9:
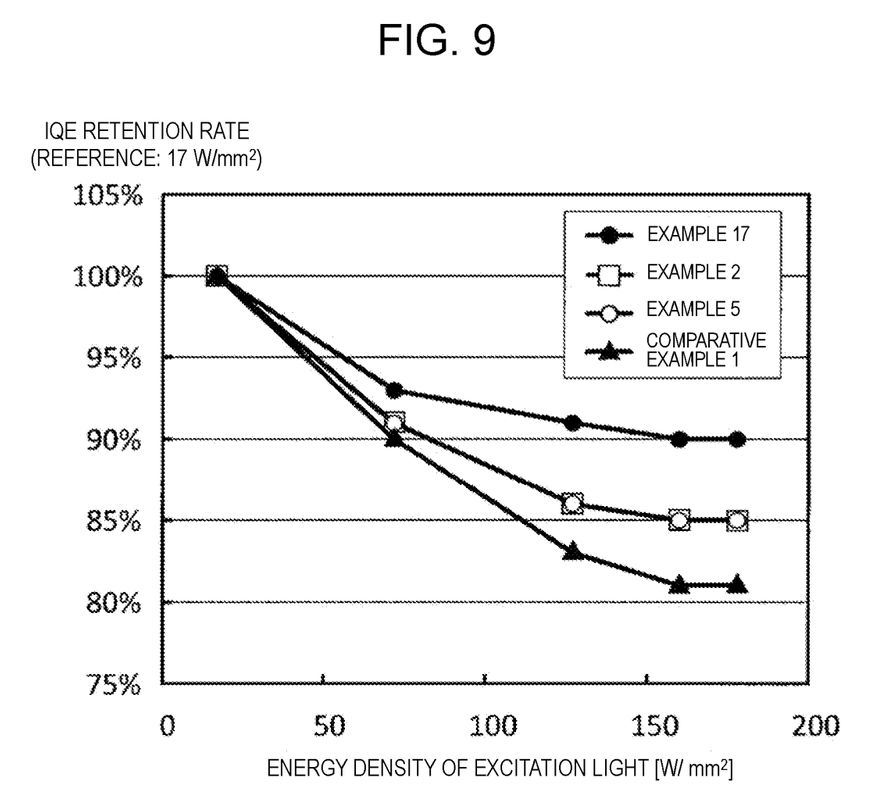
FIG. 9 is a graph illustrating a relationship between an energy density of excitation light and a retention rate of internal quantum efficiency of each of phosphor particles of Example 2, Example 5, Example 17 and Comparative example 1.

Moreover, an IQE retention rate of the phosphor particles was measured using the wavelength conversion member of each of Example 2, Example 5, Example 17, and Comparative example 1. Specifically measured was IQE of the phosphor particles of each of Example 2, Example 5, Example 17, and Comparative example 1 when the energy density of the excitation light was 17 W/mm², 70 W/mm², 130 W/mm², 160 W/mm², or 180 W/mm². The IQE retention rate of the phosphor particles was calculated while taking as a reference the IQE of the phosphor particles when the energy density of the excitation light was 17 W/mm². FIG. 9 shows a relationship between the energy density of the excitation light and the IQE retention rate of the phosphor particles.

<Comprehensive Evaluation>

The phosphor particles of Examples 1 to 16 and Comparative examples 1 to 3 were comprehensively evaluated based on the peak wavelength, the IQE, and the IQE retention rate. In detail, the comprehensive evaluation was carried out by the following method. First, for the evaluation of each of the peak wavelength, the IQE, and the IQE retention rate, x was defined as 0 points. Δ was defined as 2 points. ○ was defined as 3 points. ⊚ was defined as 4 points. Based on these definitions, respective evaluation scores of the peak wavelength, the IQE, and IQE retention rate were summed up for each of the phosphor particles of Examples 1 to 16 and Comparative examples 1 to 3. It was determined that the overall evaluation was particularly good (⊚) for the phosphor particles having a total score of 11 points or more. It was determined that the overall evaluation was good (○) for the phosphor particles having a total score of 8 points or more and 10 points or less. It was determined that the overall evaluation was poor (x) for the phosphor particles having a total score of 7 points or less.

TABLE 1

| | $x_1$ | $y_1$ | $z_1$ | Peak wavelength [nm] | Wavelength evaluation | IQE [%] | IQE evaluation | Fluorescence lifetime [ns] | IQE retention rate [%] | IQE retention rate evaluation | Comprehensive evaluation |
|---|---|---|---|---|---|---|---|---|---|---|---|
| Comparative example 1 | 0.036 | 0 | 0 | 553 | ○ | 92 | ⊚ | 65 | 84 | X | X |
| Example 1 | 0.030 | 0 | 0 | 548 | ○ | 92 | ⊚ | 65 | 86 | ○ | ○ |
| Example 2 | 0.026 | 0 | 0 | 546 | Δ | 93 | ⊚ | 65 | 87 | ○ | ○ |
| Example 3 | 0.023 | 0 | 0 | 543 | Δ | 92 | ⊚ | 65 | 90 | ⊚ | ○ |
| Example 4 | 0.030 | 0.24 | 0 | 555 | ○ | 92 | ⊚ | 65 | 85 | ○ | ○ |
| Example 5 | 0.026 | 0.24 | 0 | 551 | ○ | 92 | ⊚ | 65 | 87 | ○ | ○ |
| Example 6 | 0.021 | 0.30 | 0 | 552 | ○ | 93 | ⊚ | 65 | 91 | ⊚ | ⊚ |
| Example 7 | 0.016 | 0.36 | 0 | 552 | ○ | 92 | ⊚ | 65 | 93 | ⊚ | ⊚ |
| Example 8 | 0.015 | 1.20 | 0 | 563 | ○ | 91 | ⊚ | 65 | 92 | ⊚ | ⊚ |
| Example 9 | 0.015 | 1.80 | 0 | 575 | ○ | 90 | ⊚ | 65 | 90 | ⊚ | ⊚ |
| Example 10 | 0.015 | 2.10 | 0 | 580 | ○ | 85 | ○ | 65 | 86 | ○ | ○ |

TABLE 1-continued

|  | $x_1$ | $y_1$ | $z_1$ | Peak wavelength [nm] | Wavelength evaluation | IQE [%] | IQE evaluation | Fluorescence lifetime [ns] | IQE retention rate [%] | IQE retention rate evaluation | Comprehensive evaluation |
|---|---|---|---|---|---|---|---|---|---|---|---|
| Comparative example 2 | 0.015 | 2.40 | 0 | 582 | ○ | 83 | X | 65 | 81 | X | X |
| Example 11 | 0.030 | 0 | 1.0 | 543 | Δ | 89 | ○ | 63 | 88 | ○ | ○ |
| Example 12 | 0.030 | 0 | 2.0 | 533 | Δ | 86 | ○ | 60 | 90 | ◎ | ○ |
| Example 13 | 0.030 | 0 | 2.2 | 531 | Δ | 85 | ○ | 58 | 87 | ○ | ○ |
| Comparative example 3 | 0.030 | 0 | 2.5 | 529 | Δ | 83 | X | — | 84 | X | X |
| Example 14 | 0.030 | 0.12 | 1.0 | 549 | ○ | 90 | ◎ | 63 | 88 | ○ | ○ |
| Example 15 | 0.030 | 0.24 | 2.0 | 548 | ○ | 88 | ○ | 60 | 90 | ◎ | ○ |
| Example 16 | 0.030 | 0.24 | 2.2 | 548 | ○ | 87 | ○ | 59 | 88 | ○ | ○ |

As seen from Table 1, the phosphor particles of Examples 1 to 3 in which $x_1$ satisfies $0.003 \leq x_1 \leq 0.03$ exhibited a higher IQE retention rate than the phosphor particles of Comparative example 1 in which $x_1$ exceeded 0.03.

As seen from the results of Examples 4 to 10, as a numeric value of $y_1$ was larger, the phosphor particles emitted light having a longer peak wavelength. In particular, the phosphor particles of Examples 6 to 9 were able to emit light having a peak wavelength of 548 nm or more, and exhibited high IQE retention rates. The phosphor particles of Comparative example 2 in which $y_1$ exceeded 2.1 exhibited a low IQE retention rate.

As seen from the results of Examples 11 to 13, as a numeric value of $z_1$ was larger, the fluorescence lifetime of the phosphor particles decreased. The phosphor particles of Comparative example 3 in which $z_1$ exceeded 2.2 emitted phosphorescent light together with fluorescent light. The phosphor particles of Comparative example 3 exhibited a low IQE retention rate.

As seen from the results of Examples 14 to 16, the phosphor particles containing both of Gd atoms and Ga atoms exhibited a high IQE retention rate, and in addition, were able to emit light having a peak wavelength of 548 nm or more.

Further, as seen from FIG. 9, in the phosphor particles of Example 17 having $x_1$ of 0.014 and the phosphor particles of Examples 2 and 5 having $x_1$ of 0.026, the decrease of the IQE retention rate was suppressed in comparison with the phosphor particles of Comparative example 1 having $x_1$ exceeding 0.03.

As described above, the phosphor particles of Examples 1 to 16, in which $x_1$, $y_1$, and $z_1$ satisfied $0.003 \leq x_1 \leq 0.03$, $0 \leq y_1 \leq 2.1$ and $0 \leq z_1 \leq 2.2$, respectively had high IQE, and in addition, exhibited a high IQE retention rate. The phosphor particles of Example 17 also exhibited a high IQE retention rate. Therefore, according to the light source device containing these phosphor particles, light having high brightness can be efficiently obtained.

Moreover, when $0.015 \leq x_1 \leq 0.03$ and $0.24 \leq y_1 \leq 2.1$ were established as illustrated in Examples 4 to 10 for the phosphor particles, light having a peak wavelength of 548 nm or more was obtained, which exhibited high IQE, and also had a good IQE retention rate. That is, the comprehensive evaluation of the phosphor particles satisfying the above $x_1$ and $y_1$ was good. Further, when $0.015 \leq x_1 \leq 0.021$ and $0.3 \leq y_1 \leq 1.8$ were established as illustrated in Examples 6 to 9 for the phosphor particles, even better results were obtained for the IQE retention rate. That is, the comprehensive evaluation of the phosphor particles satisfying the above $x_1$ and $y_1$ was particularly good.

Moreover, when $0 \leq y_1 \leq 0.24$ and $1 \leq z_1 \leq 2.2$ were established as illustrated in Examples 11 to 16 for the phosphor particles, high IQE was exhibited, and the IQE retention rate was also good. Further, when $0.12 \leq y_1 \leq 0.24$ and $1 \leq z_1 \leq 2.2$ were established as illustrated in Examples 14 to 16 for the phosphor particles, light having a peak wavelength of 548 nm or more was obtained. That is, the comprehensive evaluation of the phosphor particles satisfying the above $y_1$ and $z_1$ was good.

Therefore, according to the light source device containing these phosphor particles, light having higher brightness can be efficiently obtained.

Examples 18 and 19 and Comparative Example 4

Phosphor particles of Examples 18 and 19 and Comparative example 4 and wavelength conversion members of Examples 18 and 19 and Comparative example 4 were obtained by the same method as in Comparative example 1 (except that each of powdery yttrium oxide, powdery gadolinium oxide, powdery cerium oxide, powdery aluminum oxide, and powdery scandium oxide was weighed) such that a metal oxide could be obtained, which was represented by a composition formula $Y_{3-x2-y2}Gd_{y2}Ce_{x2}Al_{5-z2}Sc_{z2}O_{12}$, in which each of $x_2$, $y_2$, and $z_2$ satisfied a value shown in Table 2.

Next, for the phosphor particles of Examples 18 and 19 and Comparative example 4, the peak wavelength of the fluorescent light, the IQE, the fluorescence lifetime, and the IQE retention rate were measured by the same method as in Examples 1 to 16. Furthermore, the phosphor particles of Examples 18 and 19 and Comparative example 4 were comprehensively evaluated by the same method as in Examples 1 to 16. Results are shown in Table 2.

TABLE 2

|  | $x_2$ | $y_2$ | $z_2$ | Peak wavelength [nm] | Wavelength evaluation | IQE [%] | IQE evaluation | Fluorescence lifetime [ns] | IQE retention rate [%] | IQE retention rate evaluation | Comprehensive evaluation |
|---|---|---|---|---|---|---|---|---|---|---|---|
| Example 18 | 0.0.30 | 0 | 1.0 | 545 | Δ | 88 | ○ | 59 | 91 | ◎ | ○ |
| Example 19 | 0.0.30 | 0 | 1.5 | 541 | Δ | 85 | ○ | 57 | 90 | ◎ | ○ |

TABLE 2-continued

| | $x_2$ | $y_2$ | $z_2$ | Peak wavelength [nm] | Wavelength evaluation | IQE [%] | IQE evaluation | Fluorescence lifetime [ns] | IQE retention rate [%] | IQE retention rate evaluation | Comprehensive evaluation |
|---|---|---|---|---|---|---|---|---|---|---|---|
| Comparative example 4 | 0.0.30 | 0 | 2.0 | 538 | Δ | 81 | X | — | 89 | ○ | X |

As seen from the results of Examples 18 and 19, as a numeric value of $z_2$ was larger, the fluorescence lifetime of the phosphor particles decreased. The phosphor particles of Comparative example 4 in which $z_2$ exceeded 1.5 emitted phosphorescent light together with fluorescent light. Therefore, an accurate fluorescence lifetime of the phosphor particles in Comparative example 4 was not able to be measured. The IQE of the phosphor particle particles of Comparative example 4 was lower than those of Examples 18 and 19.

As described above, the phosphor particles of Examples 18 and 19, in which $x_2$, $y_2$, and $z_2$ satisfied $0.003 \leq x_2 \leq 0.03$, $0 \leq y_2 \leq 2.1$ and $0 \leq z_2 \leq 1.5$, respectively had high IQE, and in addition, exhibited a high IQE retention rate. Therefore, according to the light source device containing these phosphor particles, light having high brightness can be efficiently obtained.

INDUSTRIAL APPLICABILITY

The light source device of the present disclosure can be used, for example, for a general lighting device such as a ceiling light. Moreover, the light source device of the present disclosure can be used, for example, for a special lighting device such as a spotlight, stadium lighting, and studio lighting. Further, the light source device of the present disclosure can be used, for example, for a vehicle lighting device such as a headlamp. Moreover, the light source device of the present disclosure can be used, for example, for a projection device such as a projector and a head-up display. Further, the light source device of the present disclosure can be used, for example, for a medical or industrial endoscope light. Moreover, the light source device of the present disclosure can be used, for example, for an imaging device such as a digital camera, a mobile phone, and a smartphone. Further, the light source device of the present disclosure can be used, for example, for a liquid crystal display device of a monitor for a personal computer (PC), a notebook personal computer, a television, a personal digital assistant (PDA), a smartphone, a tablet PC, or a mobile phone.

What is claimed is:

1. A light source device comprising:
    an excitation light source that emits excitation light having an energy density of 10 W/mm² or more; and
    a phosphor layer that includes a matrix and phosphor particles embedded in the matrix, wherein the phosphor particles include at least one selected from the group consisting of metal oxides represented by a following formula (1) and metal oxides represented by a following formula (2), $$Y_{3-x1-y1}R^1_{y1}Ce_{x1}Al_{5-z1}Ga_{z1}O_{12} \quad (1)$$

$$Y_{3-x2-y2}R^2_{y2}Ce_{x2}Al_{5-z2}Sc_{z2}O_{12} \quad (2)$$

where, in the formula (1), $R^1$ includes at least one selected from the group consisting of Gd and Tb, and $x_1$, $y_1$, and $z_1$ satisfy $0.003 \leq x_1 \leq 0.03$, $0 \leq y_1 \leq 2.1$, and $0 \leq z_1 \leq 2.2$, respectively, and,
    where, in the formula (2), $R^2$ includes at least one selected from the group consisting of Gd and Tb, and $x_2$, $y_2$, and $z_2$ satisfy $0.003 \leq x_2 \leq 0.03$, $0 \leq y_2 \leq 2.1$ and $0 \leq z_2 \leq 1.5$, respectively.

2. The light source device according to claim 1, wherein $y_1$ satisfies $0.1 \leq y_1 \leq 2.1$ in the formula (1), and $y_2$ satisfies $0.1 \leq y_2 \leq 2.1$ in the formula (2).

3. The light source device according to claim 1, wherein $x_1$ satisfies $0.003 \leq x_1 \leq 0.024$ in the formula (1), and $x_2$ satisfies $0.003 \leq x_2 \leq 0.024$ in the formula (2).

4. The light source device according to claim 1, wherein the matrix includes a zinc oxide crystal oriented along a c-axis.

5. The light source device according to claim 1, wherein
    a peak wavelength of the excitation light is 360 nm or more and 480 nm or less, and
    a peak wavelength of fluorescent light emitted by the phosphor particles is 548 nm or more and 580 nm or less.

6. The light source device according to claim 1, wherein a spot diameter of the excitation light on a surface of the phosphor layer, the excitation light entering the phosphor layer, is 10 μm or more and 10 mm or less.

7. A projector comprising the light source device according to claim 1.

8. A vehicle comprising the light source device according to claim 1.

* * * * *